(12) United States Patent
Lemire et al.

(10) Patent No.: US 11,165,520 B2
(45) Date of Patent: Nov. 2, 2021

(54) SIGNAL CHECKING FOR COMMUNICATING METERS

(71) Applicant: HYDRO-QUÉBEC, Montréal (CA)

(72) Inventors: Alexandre Lemire, Laval (CA); Louis Dupont, Montréal (CA)

(73) Assignee: HYDRO-QUÉBEC, Montréal (CA)

( * ) Notice: Subject to any disclaimer, the term of this patent is extended or adjusted under 35 U.S.C. 154(b) by 0 days.

(21) Appl. No.: 16/462,867

(22) PCT Filed: Apr. 6, 2018

(86) PCT No.: PCT/CA2018/050426
§ 371 (c)(1),
(2) Date: May 21, 2019

(87) PCT Pub. No.: WO2018/184116
PCT Pub. Date: Oct. 11, 2018

(65) Prior Publication Data
US 2020/0083970 A1    Mar. 12, 2020

(30) Foreign Application Priority Data

Apr. 6, 2017 (CA) ................................ CA 2963434

(51) Int. Cl.
*H04B 17/309* (2015.01)
*H04W 16/18* (2009.01)
*H04B 17/318* (2015.01)
*G01R 22/06* (2006.01)

(52) U.S. Cl.
CPC ......... *H04B 17/318* (2015.01); *G01R 22/063* (2013.01)

(58) Field of Classification Search
CPC ... H04W 16/18; H04W 40/12; H04W 52/241; H04W 52/0245; H04W 52/245; H04W 72/085; H04B 17/318; H04B 17/309; G01R 22/063
See application file for complete search history.

(56) References Cited

U.S. PATENT DOCUMENTS

| 7,089,089 | B2 | 8/2006 | Cumming et al. |
| 7,644,290 | B2 | 1/2010 | Ransom et al. |
| 7,852,205 | B2 | 12/2010 | Huseth et al. |
| 7,994,990 | B2 | 8/2011 | Stouter et al. |
| 8,035,506 | B2 | 10/2011 | Huseth et al. |

(Continued)

FOREIGN PATENT DOCUMENTS

| CA | 2715761 A1 | 3/2011 |
| EP | 2228627 A1 | 9/2010 |

(Continued)

*Primary Examiner* — Andrew Wendell
(74) *Attorney, Agent, or Firm* — Lando & Anastasi, LLP (57) ABSTRACT

A device is provided for determining an RF coverage quality of a wireless mesh network at a given location. The device includes a communication module, a processing module, and a visual interface. The communication module is configured to communicate with nearby neighbours in the wireless mesh network. The processing module is configured to detect and calculate good neighbours having an RF signal strength above a first predetermined threshold, and a tickle success rate above a second predetermined threshold. Methods to install and validate the installation of a wireless electric meter and a passive antenna are also provided.

22 Claims, 6 Drawing Sheets

(56) References Cited

U.S. PATENT DOCUMENTS

| | | |
|---|---|---|
| 8,362,917 B2 | 1/2013 | Feldman et al. |
| 8,781,462 B2 | 7/2014 | Osterloh et al. |
| 8,786,463 B2 | 7/2014 | Brennan et al. |
| 8,791,834 B2 | 7/2014 | Brennan et al. |
| 8,896,463 B2 | 11/2014 | Brennan et al. |
| 9,270,529 B2 | 2/2016 | Jacob et al. |
| 9,347,796 B1 | 5/2016 | Rapadas |
| 9,730,078 B2 * | 8/2017 | Nixon ............ H04L 41/12 |
| 2005/0065743 A1 | 3/2005 | Cumming et al. |
| 2006/0019679 A1 | 1/2006 | Rappaport et al. |
| 2008/0095221 A1 | 4/2008 | Picard |
| 2008/0316087 A1 | 12/2008 | Stoufer et al. |
| 2009/0154398 A1 * | 6/2009 | Isozu ............ H04W 84/18 370/328 |
| 2009/0256699 A1 | 10/2009 | Huseth et al. |
| 2010/0048234 A1 * | 2/2010 | Singh ............ H04W 52/367 455/509 |
| 2010/0061272 A1 * | 3/2010 | Veillette ............ H04L 45/72 370/254 |
| 2011/0059698 A1 | 3/2011 | Huseth et al. |
| 2011/0077037 A1 | 3/2011 | Osterloh et al. |
| 2011/0140908 A1 | 6/2011 | Kosht et al. |
| 2011/0169658 A1 | 7/2011 | Feldman et al. |
| 2012/0051242 A1 | 3/2012 | Rigomier et al. |
| 2012/0154228 A1 | 6/2012 | Stoufer et al. |
| 2013/0088366 A1 | 4/2013 | Brennan et al. |
| 2013/0088367 A1 | 4/2013 | Brennan et al. |
| 2013/0088368 A1 | 4/2013 | Brennan et al. |
| 2013/0109372 A1 * | 5/2013 | Ekici ............ H04W 24/10 455/422.1 |
| 2014/0323138 A1 | 10/2014 | Kamalakannan |
| 2014/0327449 A1 * | 11/2014 | Shuey ............ G01R 22/068 324/538 |
| 2014/0355476 A1 * | 12/2014 | Anderson ............ H04W 24/02 370/254 |
| 2015/0036532 A1 | 2/2015 | Osterloh et al. |
| 2015/0078185 A1 | 3/2015 | Syed et al. |
| 2015/0102940 A1 | 4/2015 | Keech et al. |
| 2015/0110108 A1 * | 4/2015 | Jacob ............ H04L 47/829 370/392 |
| 2016/0014613 A1 | 1/2016 | Ponnampalam et al. |
| 2016/0100320 A1 | 4/2016 | Dayanandan et al. |
| 2016/0198286 A1 | 7/2016 | Nakai et al. |
| 2016/0238643 A1 | 8/2016 | Rapadas |
| 2017/0366956 A1 * | 12/2017 | Yoshida ............ H04W 72/005 |
| 2018/0302294 A1 * | 10/2018 | Diancin ............ H04L 41/147 |

FOREIGN PATENT DOCUMENTS

| | | |
|---|---|---|
| WO | 2006056858 A1 | 6/2006 |
| WO | 2006059195 A1 | 6/2006 |
| WO | 2010102970 A2 | 9/2010 |
| WO | 2013151768 A1 | 10/2013 |
| WO | 2016003862 A1 | 1/2016 |
| WO | 2016076771 A1 | 5/2016 |
| WO | 2018184116 A1 | 10/2018 |

* cited by examiner

SIGNAL CHECKING FOR COMMUNICATING METERS

RELATED APPLICATIONS

This application is a U.S. National Stage Application under 35 U.S.C. § 371 of International Application No. PCT/CA2018/050426, filed Apr. 6, 2018, entitled SIGNAL CHECKING FOR COMMUNICATING METERS, which claims priority to application no. CA 2,963,434, filed Apr. 6, 2017, both of which are herein incorporated by reference.

TECHNICAL FIELD

This present description generally relates to wireless communication networks. More particularly, it relates to apparatuses and methods for verifying signals of a wireless network at a given location.

BACKGROUND

Technicians often face difficulties and/or uncertainties when installing electric meters which communicate wirelessly. A solution is desired to assist with the installation process and to mitigate existing problems.

SUMMARY

According to an aspect, a device configured to determine an RF coverage quality of a wireless mesh network at a given location is provided. The device includes: a communication module for communicating with the wireless mesh network, the communication module having an antenna to receive RF signals from neighbours near said given location, and configured to measure the RF signals to create a list of nearby neighbours, and, for each of these neighbours, to measure parameters including the strength of the RF signal received from said neighbour and a tickle success of the neighbour; a microcontroller connected to the communication module, said microcontroller being configured to detect, within a minimal period of time, each neighbour from the list of neighbours whose parameters satisfy the following criteria: the strength of the RF signal is above a first predetermined threshold; and the tickle success is above a second predetermined threshold; the microcontroller being configured to calculate a number of neighbours, referred to as good neighbours, which satisfy said criterion; and a visual interface operated by the microcontroller to display an indicator of the RF coverage quality of the mesh network, the RF coverage quality being representative of the calculated number of good neighbours.

According to another aspect, a method for determining an RF coverage quality of a wireless mesh network at a given location is provided. The method includes the steps of: a) receiving, at the given location, RF signals from nearby neighbours in the mesh network; b) measuring the RF signals to create a list of nearby neighbours; c) for each of the nearby neighbours, analyzing parameters including a strength of the RF signal received from the neighbour and a tickle success of the neighbour; d) detecting, within a minimal period of time, each neighbour in the list of neighbours whose parameters satisfy the following criteria: the power of the RF signal is above a first predetermined threshold, and the tickle success is above a second predetermined threshold; e) calculating a number of neighbours, referred to as good neighbours, which satisfy said criteria; and f) display an indicator of the RF coverage quality of the mesh network, the RF coverage quality being representative of the calculated number of good neighbours.

Preferably, according to a third aspect, a method is provided for installing a wireless communicating electric meter at a site, said electric meter being intended to form part of a wireless mesh network. The method includes the following steps: a) assessing the coverage of the wireless mesh network at the site according to the steps described above; b) determining if the calculated number of good neighbours is above a predetermined threshold; and c) installing the wireless communicating electric meter at the site if the calculated number of good neighbours is above said predetermined threshold.

Preferably, according to an aspect, a method is provided to improve the coverage quality of a mesh network in an enclosed area. The method includes the following steps: a) assessing the coverage of the wireless mesh network at a position outside the enclosed area according to the above-mentioned steps; b) determining if the calculated number of good neighbours is above a predetermined threshold; c) installing a passive antenna at said position if the calculated number of good neighbours is above said predetermined threshold; and d) connecting the passive antenna to a meter located inside the enclosed area.

According to an embodiment, a device for determining an RF coverage quality of a wireless mesh network at a given location is provided. The device includes: a communication module for communicating with the wireless mesh network, the communication module having an antenna to receive RF signals from neighbours near the given location, and being configured to measure the RF signals received from the nearby neighbours and, for each of these neighbours, analyze parameters including a strength of the RF signal received from the neighbour and a tickle success of the neighbour; a processing module connected to the communication module, said processing module being configured to detect each nearby neighbour whose parameters satisfy the following criteria: the strength of the RF signal is above a first predetermined threshold; and the tickle success is above a second predetermined threshold; the processing module being configured to calculate a number of neighbours, referred to as good neighbours, which satisfy said criteria; and a visual interface operable by the processing module to display an indicator of the RF coverage of the mesh network, the RF coverage being representative of the calculated number of good neighbours.

According to an embodiment, a method for determinizing an RF coverage quality of a wireless mesh network at a given location is provided. The method includes the following steps: a) receiving, via an antenna at the given location, RF signals from nearby neighbours in the mesh network; b) measuring the RF signals via a communication module and, for each neighbour, analyzing parameters including the strength of the RF signal received from the neighbour and a tickle success rate of the neighbour; c) detecting, via a processing module, each nearby neighbour whose parameters satisfy the following criteria: the strength of the RF signal is above a first predetermined threshold; and the tickle success rate is above a second predetermined threshold; d) calculating, via the processing module, a number of neighbours, referred to as good neighbours, which satisfy said criteria; and e) displaying, on a visual interface, an indicator of the RF coverage quality of the mesh network, the RF coverage quality being representative of the calculated number of good neighbours.

According to an embodiment, there is provided a non-transitory computer readable medium configured to allow a processor to carry out a process to determine an RF coverage quality of a wireless mesh network at a given location. The memory includes instructions that, once executed, carry out the following steps: a) receiving, via an antenna, RF signals at the given location from nearby neighbours in the mesh network; b) measuring, via a communication module, the RF signals and, for each neighbour, analyzing parameters including the strength of the RF signal received from the neighbour and a tickle success of the neighbour; c) detecting, via a processing module, each nearby neighbour whose parameters satisfy the following criteria: the strength of the RF signal is above a first predetermined threshold; and the tickle success is above a second predetermined threshold; d) calculating, via the processing module, a number of neighbours, referred to as good neighbours, which satisfy said criteria; and e) displaying, on a visual interface, an indicator of the RF coverage quality of the mesh network, the RF coverage quality being representative of the calculated number of good neighbours.

According to an embodiment, a system is provided to validate the installation of an exterior passive antenna positioned on an exterior side of a barrier and connected, via a cable, to an interior passive antenna positioned on an interior side of the barrier. The system includes at least two devices including: a first device for positioning near the interior passive antenna; and a second device for positioning near the exterior passive antenna; the first and the second device each include: a communication module for communicating in a wireless network, the communication module having an antenna to receive RF signals from nearby neighbours relayed via the interior and exterior antennas, the communication module being configured to measure the RF signals and analyze their strength; a processing module connected to the communication module, the processing module being configured to identify the RF signals coming from one of the at least two devices and to determine if the strength of these RF signals is above a first predetermined threshold for a predetermined testing period following initialization of the device; and a visual interface operable by the processing module to display an indicator representative of a success state corresponding to the RF signals being above the first predetermined threshold for the predetermined testing period, an indicator representative of a failure state corresponding to the RF signals being below the first predetermined threshold for the predetermined testing period, and an indicator representative of a lack of communication with the other device.

DETAILED DESCRIPTION OF THE PREFERRED EMBODIMENTS

Figure 1:
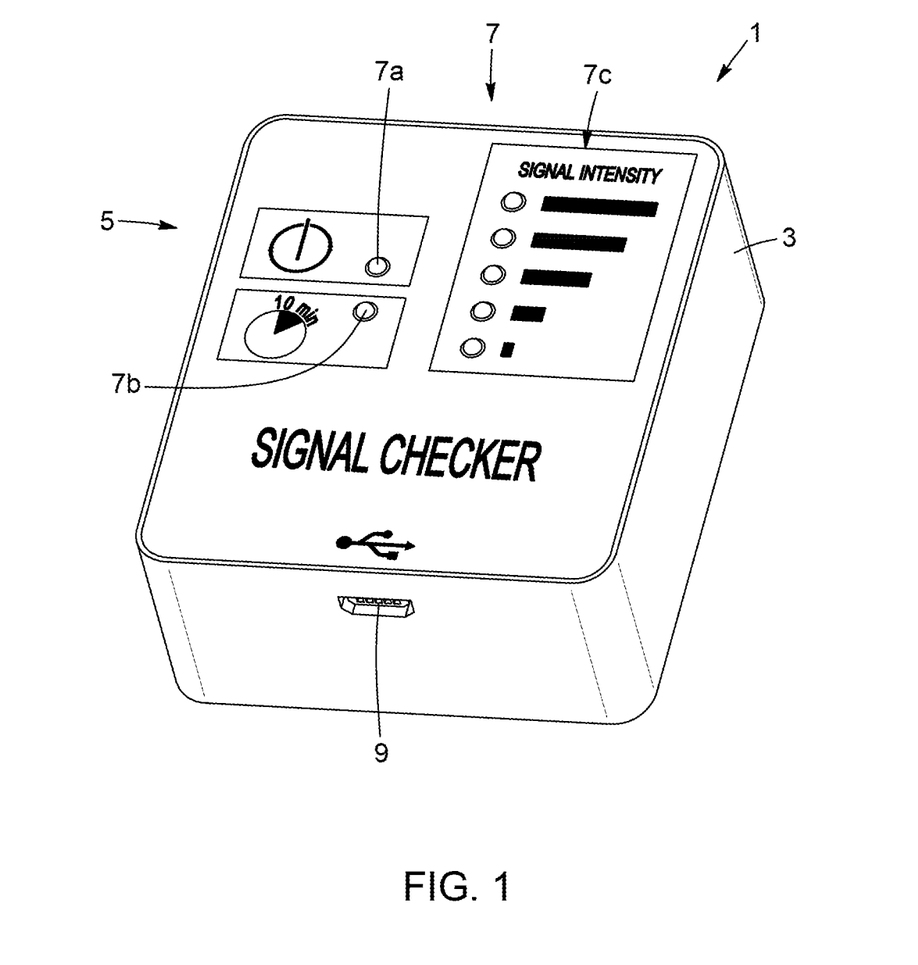
FIG. 1 is a perspective view of a device to determine the coverage of a mesh network, according to an embodiment.

With reference to FIG. 1, a device 1 for determining a radio frequency (RF) coverage of a wireless mesh network is shown according to an embodiment. Broadly described, the device 1 is configured to determine the RF coverage of the mesh network at a given location, and to display an indicator of the RF coverage on a simple interface. This device can allow a technician in the field to easily determine if there is adequate RF coverage at a given location, for example when installing a wireless communicating electric meter or a passive antenna.

The device 1 includes a housing 3 for supporting and/or protecting an electronic assembly. Preferably, the housing 3 is configured to be significantly portable. For example, casing 3 is preferably made of a lightweight material and is shaped so that it can be carried by an individual. In the present embodiment, the casing 3 is made of plastic so that it can be carried by hand. However, it is appreciated that casing 3 can be made of other materials, such as metal, and can be shaped differently.

Casing 3 is configured with an inner cavity so that is can receive and enclose the electronic assembly. Preferably, the casing 3 is configured to allow RF signals to travel between the inner cavity and the outer side of casing 3 without interference. According to the present embodiment, casing 3 is entirely made of a plastic which is permeable to RF signals. In other embodiments, if for example casing 3 is made of a metal, casing 3 can include an exterior antenna and/or openings or windows to allow the RF signals to travel.

The device 1 is provided with a human interface 5 to communicate with a user. In the present embodiment, the human interface 5 is a visual interface and includes a plurality of light-emitting diodes (LED) 7 that can be illuminated to show the status of device 1, in addition to the results of the determination of RF coverage. A first LED 7a indicates whether device 1 is powered on, a second LED 7b indicates whether the analysis of the RF coverage is complete, and a group of LEDs 7c indicates the quality of the RF coverage on a scale of 5 levels. In other embodiments, the human interface 5 can include other indicators for different parameters relating to the operation of the device. Furthermore, in other embodiments, the visual interface can include other components, such as a liquid crystal display (LCD). Finally, although the human interface 5 is a visual interface in the present embodiment, it is appreciated that other types of interfaces are possible, such as audio interfaces and/or touch interfaces. The human interface 5 can also include input devices, such as buttons, in order to receive commands from the user.

The device 1 is also provided with an electrical interface 9 so that the device can be powered by an external source. In the present embodiment, the electrical interface 9 includes a USB port and can thus also act as a digital communication interface, for example to receive commands and/or transmit results to an external device. It is appreciated that in other embodiments, device 1 can be powered by other sources, such as batteries. Furthermore, device 1 can be configured to communicate with an external device by other means, for example via a wireless interface such as a Bluetooth connection.

Figure 2:
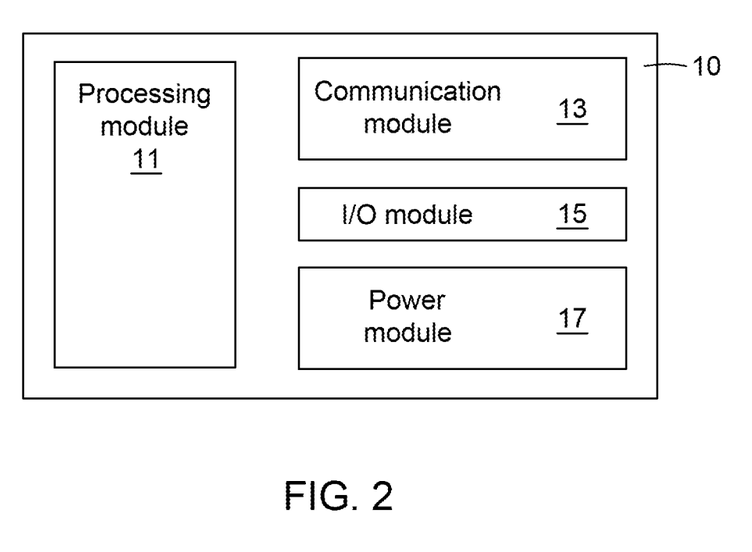
FIG. 2 is a block diagram showing the electronic assembly in the device of FIG. 1, according to an embodiment.

With reference now to FIG. 2, an electronic assembly 10 is schematically illustrated according to a preferred embodiment. The electronic assembly includes a number of modules that can be implemented via digital and/or analog components, including, for example, analog circuits, application specific integrated circuits (ASIC), programmable logic devices (PLD), microcontrollers, microprocessors, etc. These components can be provided on one or more printed circuit boards (PCB), or on other supports. In the present embodiment, the electronic assembly 10 includes a processing module 11, a communication module 13, an input/output (I/O) module 15 and a power module 17. Each one of these modules can be provided on a dedicated board, or alternatively the modules can be integrated together. Furthermore, a different combination of modules can be provided depending on the device 1 requirements.

The communication module 13 is configured to communicate with the wireless mesh network and to measure parameters of RF signals received from neighbours in the network. More particularly, the communication module 13 includes at least one antenna to receive RF signals, as well as means, such as a microprocessor or a microcontroller, to measure, interpret and/or analyze received RF signals. In the present embodiment, the communication module 13 is a separate board and includes dedicated resources and components to implement its functions. More specifically, the module 13 includes the single-board computer "UtiliNet SCADA Single Board Radio" by a Landis+Gyr®. This single-board computer is configured to create a list of nearby neighbours and to measure the RF signals received from each neighbour in order to extract several parameters, including: the RSSI ("Received Signal Strength Indication") signal power; the tickle success rate (tickle %); the data transmission success rate; the signal to noise ratio (SNR); the layer level, the transmission speed, the type of neighbour; and the response time. The list of neighbours, as well as the analyzed parameters, can be accessed via digital and/or analog interfaces. In other embodiments, other boards can be used depending on the type of network with which device 1 is to communicate. Furthermore, in some embodiments, the communication module 13 can be integrated with other modules rather than being a dedicated board.

The IO module 15 is configured to manage the device's inputs and outputs. In the present embodiment, the I/O module 15 controls the human interface 5 of the device 1. In other embodiments, other interfaces are possible. For example, the I/O module 15 can communicate with other devices.

The power module 17 is configured to power the electronic assembly 10. In the present embodiment, the power module 17 manages the electrical power received via the USB port. In other embodiments, it can manage other sources of electricity, such as rechargeable batteries.

The processing module 11 is configured to perform logical operations, and to coordinate the various modules. For example, the processing module 11 can include a microcontroller, as well as a memory to store instructions that can be executed by the microcontroller, in order to implement the different steps described below.

The processing module 11 is configured to determine the coverage quality of the RF network at a given location. In the present embodiment, the coverage quality is determined according to a number of good neighbours near the device 1. A good neighbour corresponds to a neighbour in the mesh network with which device 1 can communicate easily and reliably. The processing module 11 can detect good neighbours in several steps, for instance, by verifying several parameters of RF signals received from the communication module 13.

Figure 3A:
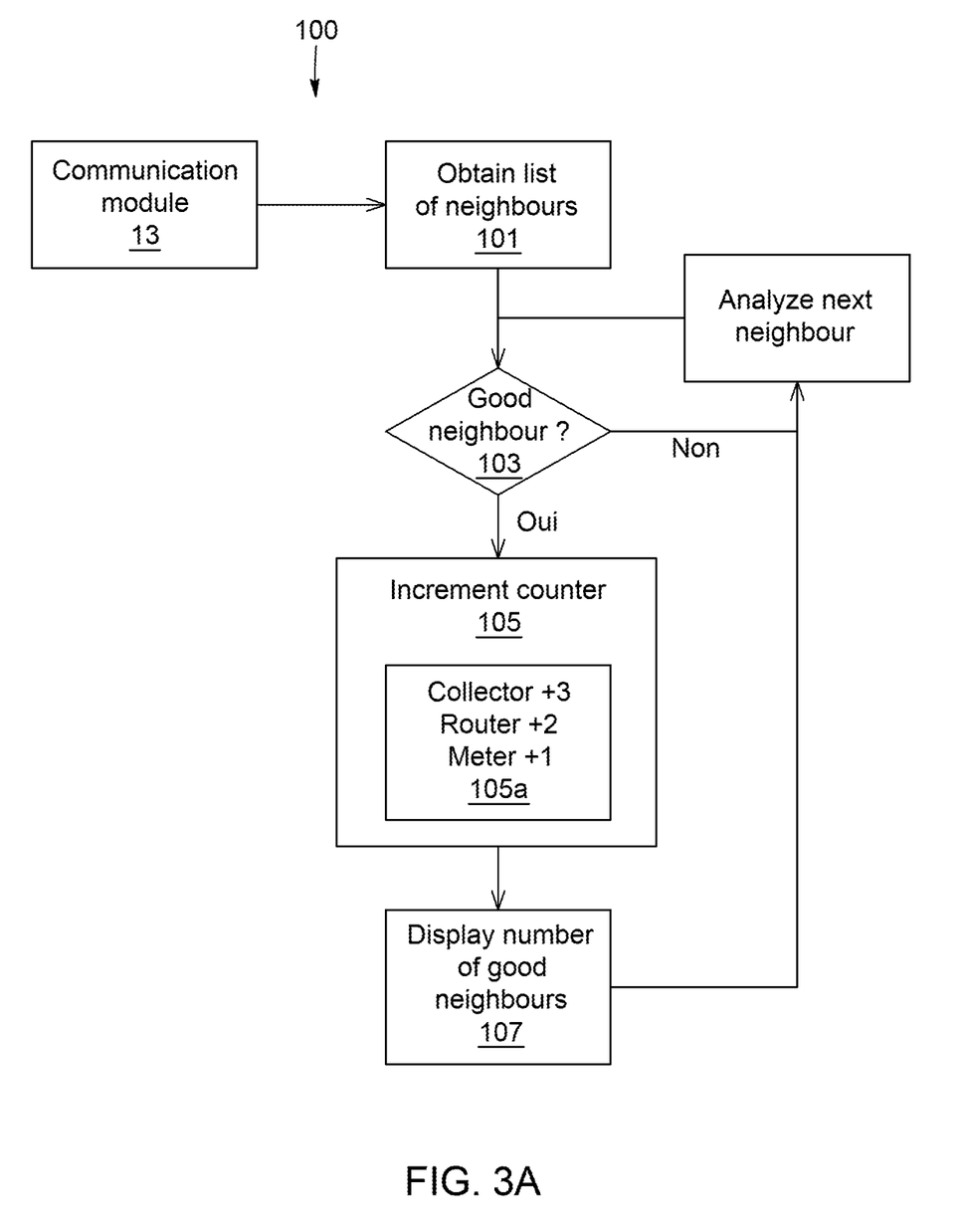
FIGS. 3A et 3B are flowcharts showing a method to determine coverage of a mesh network, according to an embodiment.
Figure 3B:
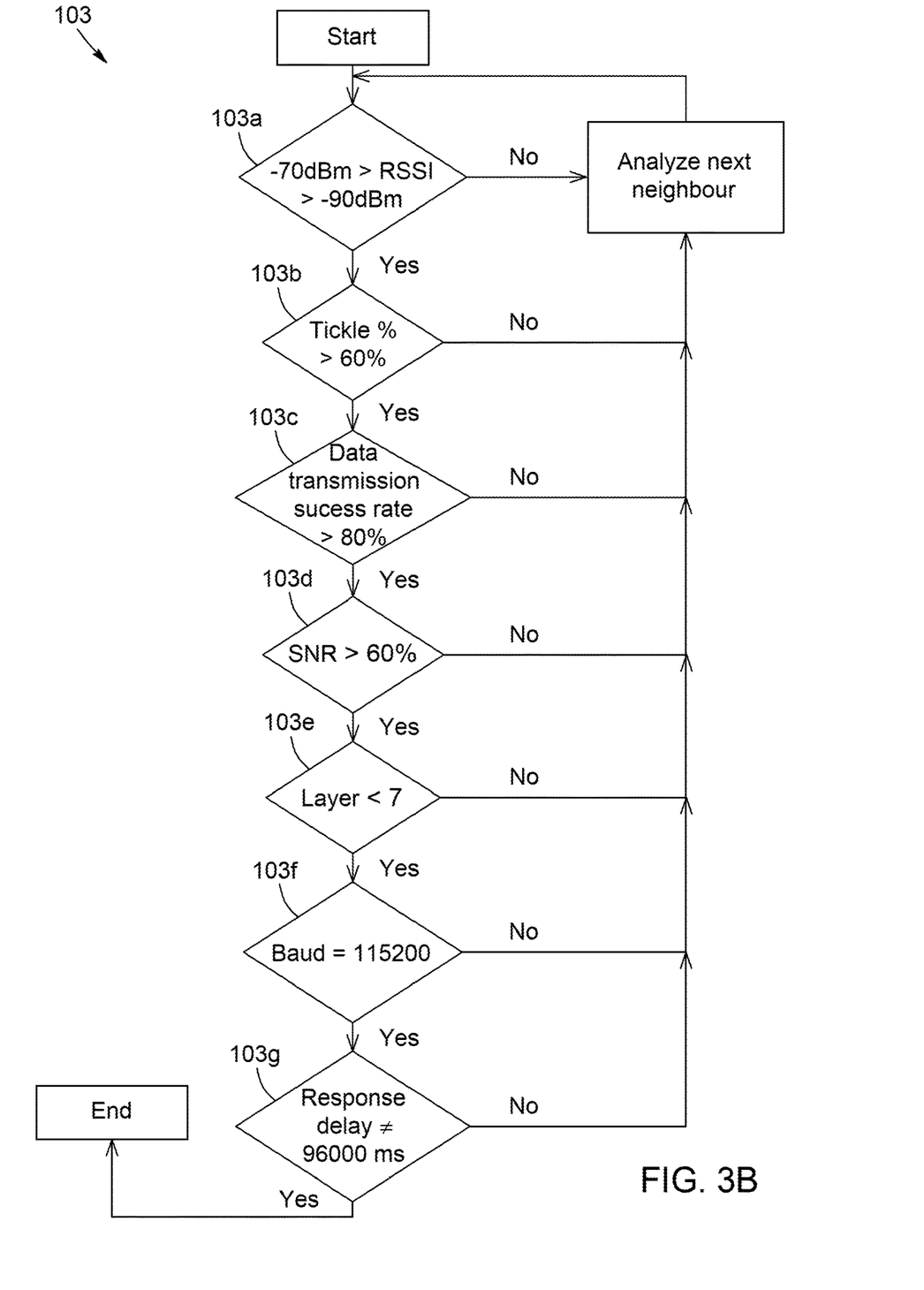

With to FIG. 3, a method 100 for determinizing the RF coverage quality of a wireless mesh network is illustrated according to a preferred embodiment. A first step 101 consists of obtaining a list of neighbours. In the present embodiment, the list of neighbours is received from the communication module 13, and consists of every neighbour in the mesh network that is near the device 1. The list of neighbours also includes a list of several parameters analyzed by the communication module 13 regarding the RF signals received from each neighbour in the list.

After receiving the list of neighbours and parameters, a second step 103 consists of traversing the list of neighbours and verifying the parameters of each neighbour to determine whether these neighbours qualify as good neighbours. Throughout the method 100, a counter is used to keep track of the number of good neighbours detected. If the neighbour being verified in step 103 is qualifies as a good neighbour, the counter is increased at step 105, and the method proceed to analyze the next neighbour in the list. If the neighbour analyzed at step 103 does not qualify as a good neighbour, the method proceeds to directly to analyze the next neighbour in the list without incrementing the counter. Once the number of good neighbours has been counted, a corresponding indicator can be displayed on the interface at step 107. It is appreciated that in some embodiments, several neighbours can be verified in concurrently.

The verification step 103 can include several sub-steps in which different parameters of a neighbour can be verified. Each sub-step can include the verification of a single parameter—if the parameter satisfies predetermined criteria, the following parameter can be verified; if the parameter does not satisfy the predetermined criteria, the neighbour will not be deemed a good neighbour and it will not be necessary to verify subsequent parameters. Although some sub-steps are described hereafter, it is understood that they are not all essential, and that a different combination of parameters can be verified in other embodiments. Furthermore, the sub-steps described below are not presented in any particular order. Preferably, the parameters are verified in descending order of importance, but the order of the verified parameters can vary from one embodiment to the other. It is also appreciated that in some embodiments, some parameters can be verified simultaneously.

In the present embodiment, a first sub-step 103a consists of analyzing the strength of the RF signal received from the neighbour. During this sub-step 103a, the processing module 11 determines if the power of the RF signal received from the neighbour is above a predetermined threshold. In the present embodiment, the strength of the RF signal is received from the communication module 13 in dBm RSSI, and the processing module 11 determines if the RSSI is above a threshold of −90 dBm. It is appreciated, however, that other units of power can be used, and that a higher or a lower threshold is also be possible. Furthermore, in some embodiments, the processing module 11 can determine if the RF signal is also below a predetermined threshold, for example below −70 dBm. Such a determination can help prevent false positives by discarding power data that is much higher than what is reasonably achievable in practice, and that is probably due to the presence of several meters in close proximity (for example in an electrical room).

A second sub-step 103b consists of analyzing if connections with the neighbour can be established in a reliable manner. In the present embodiment, the reliability of establishing connections is received from the communication module 13 in the form of a tickle success rate percentage. This percentage represents the number of successful attempts relative to the total number of attempts to establish a connection with the neighbour. The processing module 11 determines if the tickle success rate percentage is above a predetermined threshold, for example if it is higher than 50%, or, preferably, if it is higher than 60%. It is appreciated that other thresholds are possible, as well as other parameters representing how easily a connection can be established with the neighbour.

A third sub-step 103c consists of analyzing if data can be transmitted to the neighbour in a reliable manner. In the present embodiment, the reliability of data transmission is received from the communication module 13 in the form of a data transmission success rate percentage. This is a percentage that can represent the number of successful attempts compared to the total number of attempts to transmit data to the neighbour. The processing module 11 determines if the data transmission success rate percentage is higher than a predetermined threshold, for example if it is higher than 50% or, preferably, if it is higher than 80%. It is appreciated that other thresholds are also be possible, as well as other parameters representing how easy data can be transmitted to the neighbour.

A fourth sub-step 103d consists of analyzing the noise level in the RF signal. In the present embodiment, the measurement of the noise level is received from the communication module 13 in the form of a signal-to-noise ratio (SNR), given as a percentage. The processing module 11 determines if the noise level is below a given threshold, for example if the SNR is higher than 50%, or, preferably, if it is higher than 60%. It is appreciated that other thresholds are possible, as well as other parameters representing the level of noise in the RF signal received from the neighbour.

A fifth sub-step 103e consists of analyzing the number of communication nodes in the mesh network which separate the neighbour from a central node. For example, in a mesh network for electrical meters, a central node can correspond to a collector. In the present embodiment, the layer level of the neighbour, which is representative of the separation between the neighbour and a collector, is received from the communication module 13. More particularly, if the layer level is 0, the neighbour communicates directly with a collector; if the layer level if 1, the neighbour communicates with another neighbour who communicates directly with a collector; if the layer level is 2, the neighbour communicates with a neighbour who, on his part, communicates with another neighbour who communicates with the collector, etc. The processing module 11 determines if layer level of the neighbour is below a predetermined threshold, for example if the layer level is below 7. It is appreciated that other thresholds are also be possible, as well as other parameters representing the separation between the neighbour and the central node.

A sixth sub-step 103f consists of analyzing the speed at which data can be transmitted to the neighbour. In the present embodiment, the transmission speed is received from the communication module 13 in the from of a baud rate. The processing module 11 determines if the transmission speed is above a predetermined threshold, for example if the baud rate is equal to or greater than 115200. In some embodiments, the mesh network can have a nominal value for the transmission speed of different devices in the network, and the processing module 11 can determine if the transmission speed of the neighbour is equal to its corresponding nominal value. For example, the processing module 11 can determine if the baud rate is equal to 115200. It is appreciated that other thresholds are also possible, as well as other parameters representing the transmission speed of the neighbour.

A seventh sub-step 103g consists of analyzing the amount of time needed to communicate with a central node of the mesh network through the neighbour. In the present embodiment, the response time of a collector is received from the communication module 13 measured in milliseconds. If the collector cannot be reached, a 960,000 ms maximal value is received. Thus, the processing module 11 can determine that a collector can be reached through the neighbour if the response time is not 960,000 ms. Alternatively, the processing module 11 can determine if the response time is below a predetermined threshold, for example if it is below 700,000 ms. It is appreciated that other thresholds are possible, as well as other parameters representing the amount of time required to communicate with a collector.

If all criteria of the above-described sub-steps are satisfied, the neighbour is qualified as a good neighbour, and the good neighbour counter can be incremented in step 105. In some embodiments, incrementing the counter can include a sub-step 105a which consists of assigning a weight according to the type of neighbour. For example, in a mesh network for electric meters, a neighbour can be a meter, a router, or a collector. In the present embodiment, routers are assigned a more significant weight than meters, and collectors are assigned a more significant weight than routers. In particular, the type of neighbour is received from the communication module 13, and the good neighbour counter is incremented by three if the neighbour is a collector, by two if the neighbour is a router, and by one if the neighbour is a meter. It is appreciated that in other embodiments, the weight assigned to each type of neighbour can differ and that there can be other types of neighbours in the network. It is also appreciated that the weight assigned to each neighbour can vary depending on the context in which the method is used. For example, if the method is used during the installation of a meter, each type of neighbour can be assigned the same weight. However, if the method is used during the installation of an antenna, the routers and the collectors can be assigned a more significant weight than meters. For example, the good neighbour counter can be incremented by two if the neighbour is a router or a collector, and by one if the neighbour is a meter.

Finally, once the good neighbours have been counted, the I/O module 15 can be operated in step 107 to display an indicator on the human interface 5 corresponding to the coverage of the wireless mesh network. In the present embodiment, the LEDs 7c are turned on to indicate the quality of the coverage according to the number of detected good neighbours. More specifically, the LEDs 7c are turned on to indicate the coverage on a linear scale between one and five bars: one bar is displayed when two good neighbours have been identified; two bars are displayed when four good neighbours have been identified; three bars for six good neighbours, etc. It is appreciated that in other embodiments, the quality of the coverage can be displayed differently and/or that other scales can be used depending on the device requirements. For example, the quality of the coverage can be represented as a percentage, and/or the scale can be nonlinear.

The above-described method 100 can allow for coverage quality to be evaluated quickly. However, it is appreciated that there can be anomalies if the method 100 is only carried out once. Therefore, in some embodiments, the method 100 can be carried out a predetermined number of times, for example at least three times, or preferably at least five times. Furthermore, in some embodiments, the method 100 can be carried out several times within a minimal predetermined period. For example, the method 100 can be carried out continuously for a minimal period of five minutes, or preferably ten minutes. In some embodiments, the method can be stopped before the minimal period has elapsed if a predetermined number of good neighbours has been detected. During each repetition of the method, the interface 5 can change to reflect the number of good neighbours currently detected. When the method 100 has been carried out a predetermined number of times, or when the minimal period of time has elapsed, the interface 5 will not change anymore, and an indicator can be shown to indicate to a user that the analysis is completed, for example by turning on LED 7b.

It is appreciated that the above-described device can provide means to easily determine the coverage of a mesh network at a given location. The results are displayed on a simple interface, allowing a user to easily see the results with little risk of error. Furthermore, all calculations and analyses are carried out by the device itself, without requiring additional equipment or particular user expertise. The device is also handheld and can thus be easily carried to a given location in order to determine the coverage of a mesh network at that location.

Such a device can be useful for several tasks related to the installation of a wireless electric meter. For example, before installing an electric meter at a specific location, a technician could operate the device to determine the quality of the coverage. The technician can subsequently install a wireless communicating electric meter only if the device displays a minimal predetermined coverage quality, for example at least two bars (four good neighbours) for urban areas, or at least one bar (two good neighbours) for rural areas. If the minimal coverage is not reached, the technician can choose to install an electric meter with a different communication type, or find another location to install the wireless communicating electric meter by using the device.

In another scenario, the device can be useful when installing passive antennas to improve the coverage of a wireless mesh network at a given location, for example inside a building or across a barrier such as a wall or any other obstacle that could interfered with the propagation of RF signals. A technician can analyze the coverage of a wireless network at several locations outside of the building or the barrier. After finding a location with an acceptable minimal coverage (for example, a location having a calculated number of good neighbours that is above a predetermined threshold), the technician can then install a passive antenna at that location to extend coverage inside the building or across the barrier. The signals can be transmitted across the barrier and/or inside the building via a coaxial cable, for example. One end of the coaxial cable can be connected to an exterior passive antenna on an exterior side of the barrier, for example via a coaxial connector, and the other extremity can be connected to an interior passive antenna on an inner side of the barrier. In this configuration, the signals can be propagated through the barrier, between the two antennas via the coaxial cable. It is appreciated that other configurations are possible to bring extend coverage inside a building and/or across a barrier.

Figure 4A:
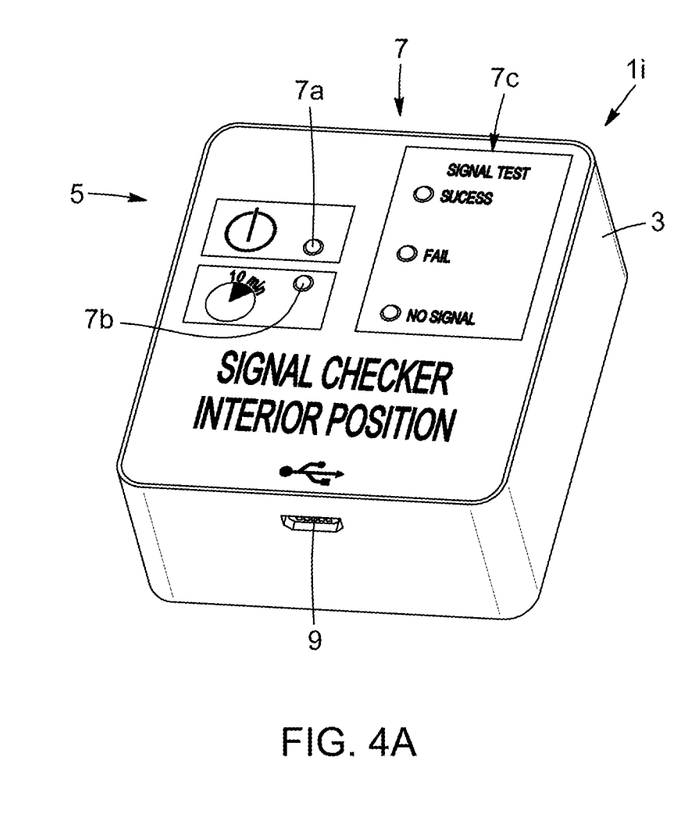
FIGS. 4A et 4B are perspective views of a pair of devices to assess signal quality, according to an embodiment.
Figure 4B:
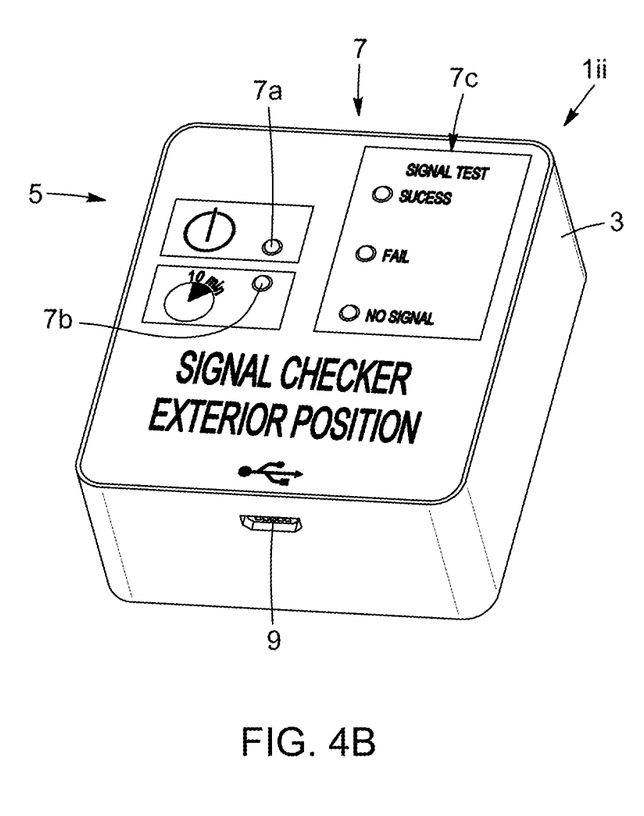

In some embodiments, the device can be configured to validate the installation of a passive antenna. With reference to FIGS. 4A and 4B, a system to validate the installation of a passive antenna is illustrated according to a preferred embodiment. The system includes a first device 1i and a second device 1ii that are respectively positioned on opposite sides of a barrier. The devices 1i and 1ii include generally the same modules as the above-described device 1, including the electronic assembly 10, which comprises the processing module 11, the communication module 13, the input/output module 15 and the power module 17. However, the devices 1i and 1ii are particularly configured to only measure and analyze signals that are propagated through the passive antenna and its corresponding cable. More particularly, the devices 1i and 1ii are configured to only communicate with one another. In other words, the devices 1i and 1ii are paired.

The visual interface 7 of the devices 1i and 1ii is preferably configured display the results of the passive antenna test in a clear and simple manner. In the embodiment illustrated in FIGS. 4A and 4B, the cluster of LEDs 7c includes three LEDs that can be individually turned on to indicate the testing state: either a success state, a failure state, or state of lack of communication. For example, the success state can be reached if all test criteria are satisfied, the failure can be reached if the test criteria are not met, and the lack of communication state can be reached if the devices 1i and 1ii cannot communicate with one another. It is appreciated that other visual interface 7 configurations are also be possible.

To test the passive antenna, the devices 1i and 1ii implement a method to determine the quality of the RF signals that are propagated through the passive antenna. The quality of the signals can be determined by the processing module 11 of each device 1i and 1ii, for example by analyzing different parameters of the signals received by the other device 1i and 1ii. If the parameters satisfy predetermined criteria, the test can be considered a success. If the parameters do not satisfy the predetermined criteria, the test can be considered a failure. Finally, if the device 1i or 1ii cannot analyze the parameters and/or if no signal is received from the other device 1i or 1ii, the test can be considered as being in a state of lack of communication. In some some embodiments, the devices 1i and 1ii can remain in standby state when there is a lack of communication and, when a connection is established with the other devices, they can proceed with the test.

Preferably, each of the devices 1i and 1ii is configured to only consider signals coming from the other device with which it is paired. For example, the method can include a first step consisting of receiving from the communication module 13 a list all nearby neighbours. A second step can consist of identifying, in the list of neighbours, the neighbour that corresponds to the other device 1i or 1ii. A third step can include verifying the parameters of the identified neighbour to determine if the test is a success or a failure. There can be a lack of communication if the other device 1i or 1ii is not in the list of neighbours, or if the list is empty. It is appreciated that there can be other methods to limit the analysis only to the signals received from a paired device. For example, the processing module 11 and/or the communication module 13 can have a filter to filter/ignore all other signals coming from another source, and/or to only accept signals that correspond to a frequency or to a frequency range reserved for the two devices 1i and 1ii and which is preferably different from other wireless networks in range.

The processing module 11 can analyze several parameters and conditions to validate the quality of signals received from the other device. For example, the verification step can include several sub-steps to analyze the same parameters as step 103 as described above and illustrated in FIG. 3B. Preferably, the verification step includes at least a first sub-step, consisting of analyzing the strength of the RF signal received from the other device to determine if its power is below −70 dBm or above −90 dBm. The verification step can also include other sub-steps to analyze other combinations of parameters, such as the tickle success rate percentage, the data transmission success rate, the signal-to-noise ratio, the transmission speed, the communication time, etc., along with thresholds that correspond to those of the verification step 103. If all the criteria of the sub-steps are satisfied, the test is successful, and the success can be communicated to the user via the user interface 7. In some embodiments, the test can be conducted a predetermined number of times and/or several times within a predetermined period, before the final results are displayed on the user interface.

Figure 5:
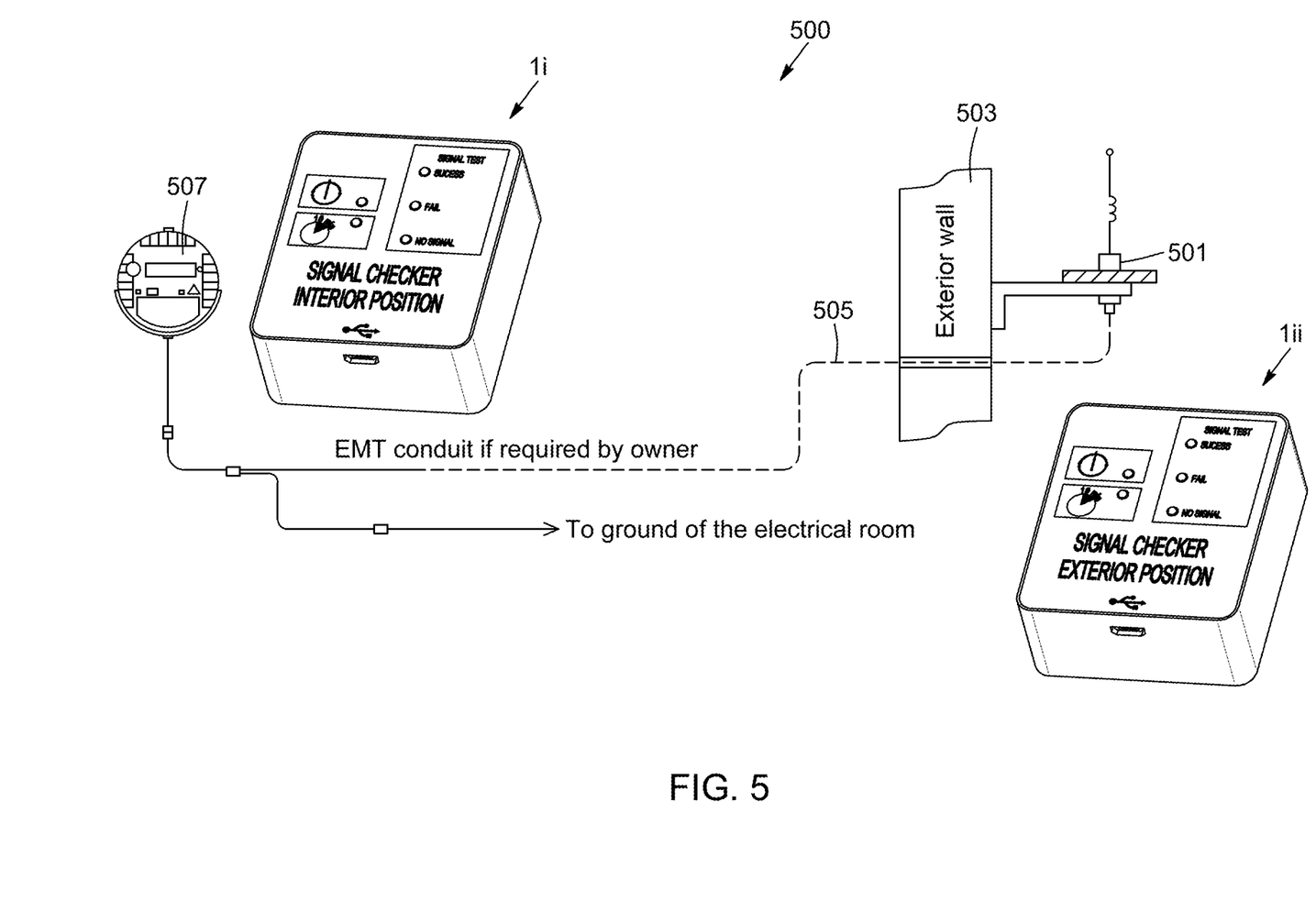
FIG. 5 is a schematic drawing showing a method to validate the installation of a passive antenna using the devices of FIGS. 4A and 4B, according to an embodiment.

With reference to FIG. 5, a method 500 to validate the installation of a passive antenna is illustrated according to an embodiment. In this configuration, a passive antenna 501 is installed on an exterior side of a wall 503 of a building. The passive antenna 501 is connected to the extremity of a coaxial cable 505, which passes through the wall to the interior of the building, for example via an EMT conduit depending on the desired configuration. To validate the installation of the passive antenna 501, a technician can connect a second antenna 507 to the second extremity of the coaxial cable on the interior side of the wall 503. The technician can then position a first testing device 1i near the second antenna 507, and preferably on the second antenna 507, and activate said device 1i. The technician can then place a second testing device 1ii near the first antenna 501, preferably in front of the first antenna 501, and activate said device 1ii. When communication is established between the two devices 1i and 1ii, the devices will proceed with the verification steps and will display the results, for example after the testing period has elapsed and/or after the verification steps have been performed a predetermined number of times. The technician can then check the user interface of the two devices 1i and 1ii to confirm that each one indicates success. If the devices indicate failure, or if there is a lack of communication, the technician can troubleshoot and fix the configuration of the antennas and repeat the test until success is achieved.

Although some configurations and embodiments have been described herein, it is appreciated that they are provided as examples only, and should not be interpreted as limiting the scope of the invention. Moreover, although some advantages have been described herein, a person skilled in the art might discover other advantages and/or characteristics associated with the invention and that have not been explicitly described.

The invention claimed is:

1. A device for determining, at a given location, an RF coverage quality of a wireless mesh network of neighbours including at least one communicating meter, the device including:
   a communication module for communicating with the neighbours of the wireless mesh network including the at least one communicating meter, the communication module having an antenna to receive RF signals from nearby neighbours of the wireless mesh network near the given location, and being configured to measure the RF signals received from the nearby neighbours and, for each of the nearby neighbours analyze parameters including a strength of the RF signal received from the neighbour and a tickle success rate of the neighbour;
   a processing module connected to the communication module, said processing module being configured to detect each of the nearby neighbours including any communicating meter whose parameters satisfy the following criteria:
      the strength of the RF signal is above a first predetermined threshold and below a third predetermined threshold, wherein the third predetermined threshold is greater than the first predetermined threshold; and
      the tickle success rate is above a second predetermined threshold;
   the processing module being configured to determine a number of neighbours that are good neighbours satisfying said criteria; and
   a visual interface operable by the processing module to display an indicator of the RF coverage of the mesh network, the RF coverage being at least in part representative of the determined number of good neighbours including any communicating meters satisfying said criteria.

2. The device according to claim 1, wherein the communication module is configured to determine a type of the neighbour from a group comprising at least: the communicating meter, a router and a collector; and wherein the processing module is configured to maintain a counter representative of the number of good neighbours, the counter being incremented by a value that varies according to the type of the neighbour.

3. The device according to claim 2, wherein the counter is incremented by a first value if the neighbour is the communicating meter, and by a second value if the neighbour is the router or the collector, the second value being greater than the first value.

4. The device according to claim 1, wherein the communication module is configured to measure the RF signals at regular intervals, and the processor is configured to identify the neighbours whose parameters satisfy the criterion each time the RF signals are measured within a predetermined minimal period.

5. The device according to claim 4, wherein the processor is configured to calculate the number of good neighbours according to the number of neighbours which satisfy the criteria at least a predetermined number of times within the predetermined minimal period.

6. The device according to claim 5, wherein the processor is configured to calculate the number of good neighbours according to the number of neighbours which satisfy the criteria at least three times within the predetermined minimal period.

7. The device according to claim 4, wherein the processor is configured to calculate the number of good neighbours according to the number of neighbours which satisfy the criteria for the duration of the predetermined minimal period.

8. The device according to claim 4, wherein the user interface comprises a visual indicator operable by the processor to indicate that the minimal period has elapsed and that the test is complete.

9. The device according to claim 1, wherein the communication module is configured to measure the RF signals a predetermined number of times, and wherein the processor is configured to identify the neighbours whose parameters satisfy the criteria every time the RF signals are measured.

10. The device according to claim 1, wherein the signal strength is measured in RSSI (Received Signal Strength Indicator), and wherein the first predetermined threshold is at least −90 dBm.

11. The device according to claim 1, wherein the tickle success rate is measured as a percentage, and wherein the second predetermined threshold is at least 50%.

12. The device according to claim 1, wherein the third predetermined threshold is equal to or less than −70 dBm.

13. The device according to claim 1, wherein the communication module is configured to analyze a data transmission success rate, and wherein the processing module is configured to detect each neighbour whose parameters further satisfy a criterion of the data transmission success rate being above a fourth predetermined threshold equal to or less than 50%.

14. The device according to claim 1, wherein the communication module is configured to analyze a noise level in the RF signal, and wherein the processing module is configured to detect each neighbour whose parameters further satisfy a criterion of the noise level in the RF signal being below a fifth predetermined threshold of at least 50%.

15. The device according to claim 1, wherein the communication module is configured to analyze a number of communication nodes separating the neighbour from a central node, and wherein the processing module is configured to detect each neighbour whose parameters further satisfy a criterion of the number of communication nodes separating the neighbour from the central node being below a sixth predetermined threshold of at least 7.

16. The device according to claim 1, wherein the communication module is configured to analyze a data transmission speed of the neighbour, and wherein the processing module is configured to detect each neighbour whose parameters further satisfy the criterion of the data transmission speed being above a seventh predetermined threshold of at least 115200 bits per second.

17. The device according to claim 1, wherein the communication module is configured to analyze the amount of time needed to communicate with a central node of the mesh network through the neighbour, and wherein the processing module is configured to detect each neighbour whose parameters further satisfy a criterion of the amount of time needed to communicate with a central node of the mesh network through the neighbour being below an eighth predetermined threshold equal to or less than 960,000 MS.

18. The device according to claim 1, wherein the communication module is configured to maintain a list of every neighbour within communication range and the analyzed parameters of the RF signals received from each neighbour, and wherein the processing module is configured to traverse the list to identify and count the neighbours which satisfy the criteria.

19. A method for determining, at a given location, an RF coverage quality of a wireless mesh network of neighbours including at least one communicating meter, the method including the steps of:
a) receiving, via an antenna at the given location, RF signals from nearby neighbours in the mesh network including the at least one communicating meter;
b) measuring the RF signals via a communication module and, for each nearby neighbour of the wireless mesh network, analyzing parameters including the strength of the RF signal received from each nearby neighbour and a tickle success rate of the nearby neighbour;
c) detecting, via a processing module, each nearby neighbour including any communicating meter whose parameters satisfy the following criteria:
the strength of the RF signal is above a first predetermined threshold and below a third predetermined threshold, wherein the third predetermined threshold is greater than the first predetermined threshold; and
the tickle success rate is above a second predetermined threshold;
d) determining, via the processing module, a number of neighbours, that are good neighbours, which satisfy said criteria; and
e) displaying, on a visual interface, an indicator of the RF coverage quality of the mesh network, the RF coverage quality being at least in part representative of the determined number of good neighbours including any communicating meters satisfying said criteria.

20. A non-transitory computer readable medium, the memory being configured to allow a processor to carry out a process in order to determine, at a given location, the RF coverage quality of a wireless mesh network of neighbours including at least one communicating meter, the memory comprising instructions that, when executed, carry out the following steps:
a) receiving, via an antenna at the given location, RF signals from nearby neighbours in the mesh network including the at least one communicating meter;
b) measuring the RF signals via a communication module and, for each nearby neighbour of the wireless mesh network, analyzing parameters including the strength of the RF signal received from each nearby neighbour and a tickle success rate of the nearby neighbour;
c) detecting, via a processing module, each nearby neighbour including any communicating meter whose parameters satisfy the following criteria:
the strength of the RF signal is above a first predetermined threshold and below a third predetermined threshold, wherein the third predetermined threshold is greater than the first predetermined threshold; and
the tickle success rate is above a second predetermined threshold;
d) determining, via the processing module, a number of neighbours, that are good neighbours, which satisfy said criteria; and
e) displaying, on a visual interface, an indicator of the RF coverage quality of the mesh network, the RF coverage quality being at least in part representative of the determined number of good neighbours including any communicating meters satisfying said criteria.

21. A device for determining an RF coverage quality of a wireless mesh network, the device including:
a communication module for communicating with the wireless mesh network, the communication module having an antenna to receive RF signals from neighbours near the given location, and being configured to measure the RF signals received from the nearby neighbours and, for each of these neighbours:
determine a type of the neighbour from a group comprising at least: a meter, a router and a collector; and
analyze parameters including a strength of the RF signal received from the neighbour and a tickle success rate of the neighbour;
a processing module connected to the communication module, said processing module being configured to detect each nearby neighbour whose parameters satisfy the following criteria:
the strength of the RF signal is above a first predetermined threshold; and
the tickle success rate is above a second predetermined threshold;
the processing module being configured to maintain a counter representative of a number of neighbours, referred to as good neighbours, which satisfy said criteria, said counter being incremented by a first value if the neighbour is a meter, and by a second value if the neighbour is a router or a collector, the second value being greater than the first value; and
a visual interface operable by the processing module to display an indicator of the RF coverage of the mesh network, the RF coverage being representative of the counter.

22. A method for determining an RF coverage quality of a wireless mesh network, the method including the steps of:
  a) receiving, via an antenna at the given location, RF signals from nearby neighbours in the mesh network;
  b) measuring the RF signals via a communication module and, for each neighbour:
    determining a type of the neighbour from a group comprising at least: a meter, a router and a collector; and
    analyzing parameters including the strength of the RF signal received from the neighbour and a tickle success rate of the neighbour; and
  c) detecting, via a processing module, each nearby neighbour whose parameters satisfy the following criteria:
    the strength of the RF signal is above a first predetermined threshold; and
    the tickle success rate is above a second predetermined threshold;
  d) maintaining, via the processing module, a counter representative of a number of neighbours, referred to as good neighbours, which satisfy said criteria, said counter being incremented by a first value if the neighbour is a meter, and by a second value if the neighbour is a router or a collector, the second value being greater than the first value; and
  e) displaying, on a visual interface, an indicator of the RF coverage quality of the mesh network, is the RF coverage quality being representative of the counter.

* * * * *

UNITED STATES PATENT AND TRADEMARK OFFICE
CERTIFICATE OF CORRECTION

PATENT NO. : 11,165,520 B2
APPLICATION NO. : 16/462867
DATED : November 2, 2021
INVENTOR(S) : Alexandre Lemire et al.

It is certified that error appears in the above-identified patent and that said Letters Patent is hereby corrected as shown below:

In the Claims

In Claim 21, Column 14, Lines 36-37:
Delete:
"A device for determining an RF coverage quality of a wireless mesh network, the device including:"
Insert:
--"A device for determining an RF coverage quality of a wireless mesh network at a given location, the device including:"--

In Claim 22, Column 15, Lines 1-2:
Delete:
"A method for determining an RF coverage quality of a wireless mesh network, the method including the steps of:"
Insert:
--"A method for determining an RF coverage quality of a wireless mesh network at a given location, the method including the steps of:"--

Signed and Sealed this
Eighth Day of November, 2022

Katherine Kelly Vidal
*Director of the United States Patent and Trademark Office*